(12) United States Patent
Travis et al.

(10) Patent No.: US 9,652,577 B2
(45) Date of Patent: May 16, 2017

(54) INTEGRATED CIRCUIT DESIGN USING PRE-MARKED CIRCUIT ELEMENT OBJECT LIBRARY

(71) Applicants: Edward O. Travis, Austin, TX (US); Ertugrul Demircan, Eugene, OR (US); Douglas M. Reber, Austin, TX (US); Michael A. Stockinger, Austin, TX (US)

(72) Inventors: Edward O. Travis, Austin, TX (US); Ertugrul Demircan, Eugene, OR (US); Douglas M. Reber, Austin, TX (US); Michael A. Stockinger, Austin, TX (US)

(73) Assignee: NXP USA, Inc., Austin, TX (US)

( * ) Notice: Subject to any disclaimer, the term of this patent is extended or adjusted under 35 U.S.C. 154(b) by 139 days.

(21) Appl. No.: 14/505,237

(22) Filed: Oct. 2, 2014

(65) Prior Publication Data

US 2016/0098510 A1  Apr. 7, 2016

(51) Int. Cl.
*G06F 17/50* (2006.01)

(52) U.S. Cl.
CPC ........ *G06F 17/5081* (2013.01); *G06F 17/505* (2013.01); *G06F 17/5072* (2013.01)

(58) Field of Classification Search
CPC ............. G06F 17/5081; G06F 17/5072; G06F 12/0802; G06F 17/5068; G11C 5/06
USPC ...................................... 716/50–55, 100–104
See application file for complete search history.

(56) References Cited

U.S. PATENT DOCUMENTS

| 7,000,214 | B2 | 2/2006 | Iadanza et al. |
| 7,458,045 | B2 | 11/2008 | Cote et al. |
| 2011/0145775 | A1* | 6/2011 | Sano ................... G06F 17/5068 716/122 |
| 2014/0189613 | A1* | 7/2014 | Tomblin .............. G06F 17/5081 716/52 |

OTHER PUBLICATIONS

Sobe et al., "Robust Analog Design for Automotive Applications by Design Centering with Safe Operating Areas," 9th International Symposium on Quality Electronic Design, San Jose, CA, Mar. 2008, 7 pages.

* cited by examiner

*Primary Examiner* — Nghia Doan

(57) ABSTRACT

This disclosure describes an approach to create a library of pre-marked circuit element objects and use the pre-marked circuit element object library to design and fabricate an integrated circuit. Each of the circuit element objects are "pre-marked" and include embedded voltage markers having independent pre-assigned voltage values for each terminal in the circuit element object. When a circuit designer inserts a pre-marked circuit element object in a schematic design, the design tool determines whether each of the circuit element object terminal's pre-assigned voltage values match their corresponding nets to which they are connected. When the circuit designer completes the schematic design that includes valid nets throughout the schematic design, the design tool generates a layout design from the schematic design. The design tool, in turn, generates mask layer data from the layout design when the layout design passes verification testing.

11 Claims, 10 Drawing Sheets

INTEGRATED CIRCUIT DESIGN USING PRE-MARKED CIRCUIT ELEMENT OBJECT LIBRARY

TECHNICAL FIELD

The present disclosure relates to creating a library of pre-marked circuit element objects that include pre-assigned terminal voltage values and utilizing the library to design and construct an integrated circuit.

BACKGROUND

Integrated circuits are typically designed using circuit elements, such as transistors, resistors, capacitors, etc., from multiple voltage domains. As such, a circuit designer must be conscientious of inserting circuit elements into a schematic design to ensure that a low voltage terminal of a circuit element is not connected to a net that includes a terminal from another circuit element producing an excessive voltage which may damage the circuit element with low voltage terminal.

Current design procedures require the circuit designer to place a circuit element on a schematic design and, in a separate action, assign voltage markers with corresponding voltages to the circuit element's terminals. The schematic design tool treats the voltage markers as separate objects from the circuit elements and must be managed by the circuit designer during the schematic design phase and layout phase to ensure that the voltage markers remain assigned to their respective circuit element terminals.

At times, the circuit designer may assign an incompatible voltage value to a circuit element's terminal. At other times, the schematic design tool or layout design tool may disassociate a voltage marker from its corresponding circuit element terminal. If a circuit designer or layout designer does not detect these issues prior to device fabrication, an integrated circuit may be fabricated that has inherently dangerous bias conditions. In turn, the integrated circuit fails qualification testing and requires an expensive and time-consuming circuit re-design effort.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

This disclosure describes an approach to create a library of pre-marked circuit element objects and use the pre-marked circuit element object library to design and fabricate an integrated circuit. The pre-marked circuit element objects correspond to semiconductor circuit elements, such as transistors, resistors, capacitors, etc., utilized to create the integrated circuit. Each of the circuit element objects are "pre-marked" and include embedded voltage markers having independent pre-assigned voltage values for each terminal in the circuit element object. In one embodiment, the pre-assigned voltage values may be discrete voltage values or voltage ranges, such as 0-3.3 Volts.

When a designer inserts a pre-marked circuit element object into a schematic design, the design tool determines whether each of the terminals' pre-assigned voltage values match their corresponding nets to which they are connected. When the designer completes the schematic design that includes valid nets throughout the schematic design, the design tool generates a layout design from the schematic design. In turn, the design tool generates mask layer data from the layout design when the layout design passes verification testing.

In one embodiment, the design tool provides a user interface to a designer that allows the designer to select a circuit element object and corresponding terminal voltage values. In this embodiment, the design tool dynamically generates a pre-marked circuit element object for the designer to insert into the schematic design.

Figure 1:
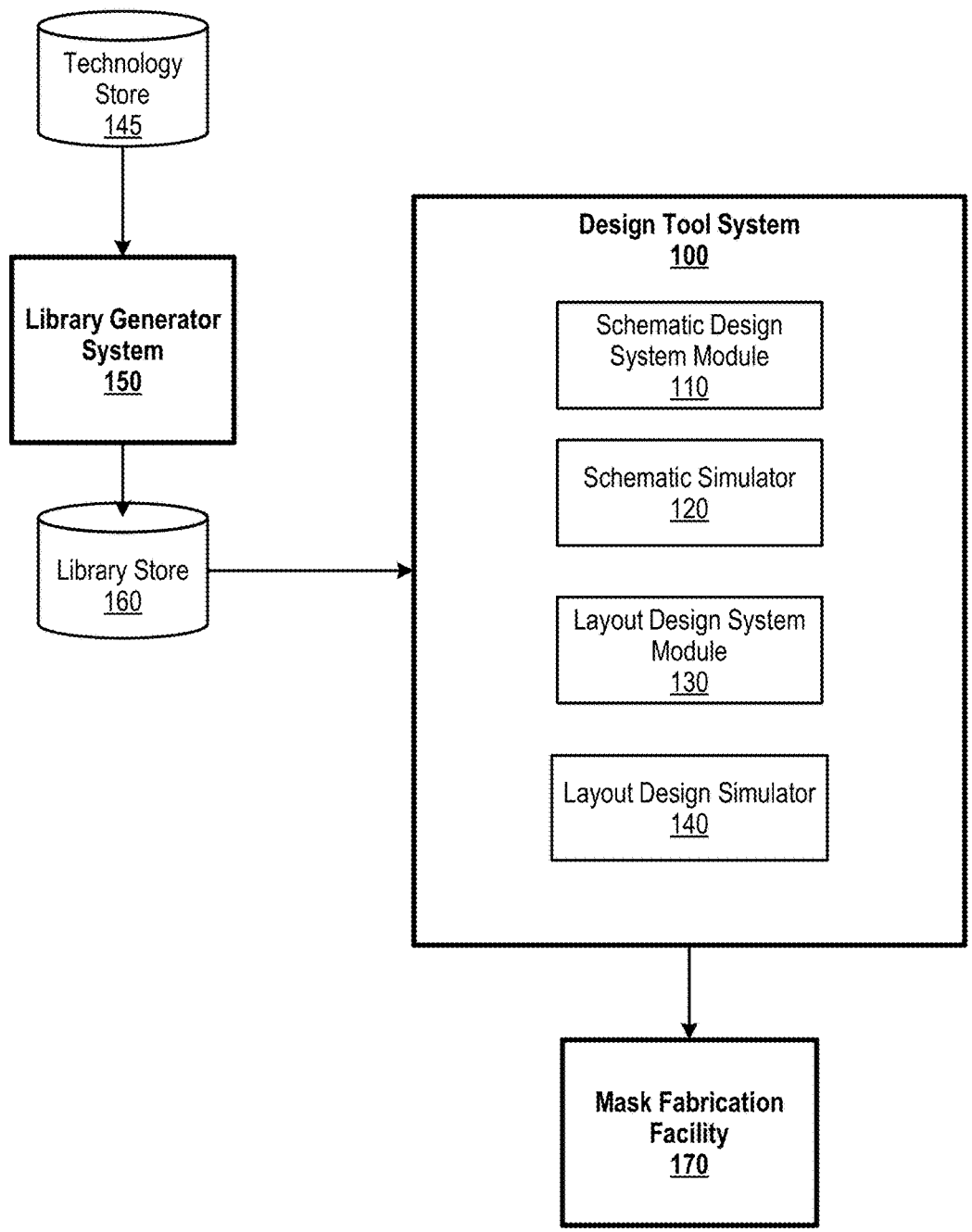
FIG. 1 is a diagram depicting one example of a library generator system that generates a pre-marked circuit element object library and a design tool system that utilizes the library to design an integrated circuit.

FIG. 1 is a diagram depicting one example of a library generator system that generates a pre-marked circuit element object library and a design tool system that utilizes the library to design an integrated circuit.

Library generator system 150 generates pre-marked circuit element objects based upon semiconductor circuit elements that are supported in a specific process technology, such as a 55 nm floating gate memories technology. For each supported semiconductor circuit element, library generator system 150 generates multiple pre-marked circuit element objects that include valid terminal voltage range combinations. For example, for a given transistor, library generator system 150 may generate eight or more pre-marked circuit element objects each having various terminal voltage range combinations (see FIG. 2 and corresponding text for further details). Each terminal has an embedded voltage marker that stores the terminal's pre-assigned voltage values. A voltage marker may be a polygon, a polygon property, a text field, or other type of data field capable of storing values that are integrated into the circuit element object prior to schematic instantiation and not treated by design tool system 100 as a separate object.

A circuit designer uses design tool system 100 and library store 160 to create a schematic design. The designer initiates schematic design system module 110, which allows the circuit designer to select various pre-marked circuit element objects and insert the selected objects into a schematic design. Since each pre-marked circuit element object includes embedded pre-assigned voltage values, the designer may visually check whether nets coupled to the inserted pre-marked circuit element object are valid by comparing the pre-assigned voltage values with other pre-assigned voltage values from other circuit element objects on the nets. In one embodiment, schematic design system module 110 automatically checks net integrity by selecting a net and ensuring that each connected terminal's pre-assigned voltage value matches (see FIG. 7 and corresponding text for further details).

When the designer finishes the schematic design, schematic simulator 120 simulates the schematic design accordingly. When the schematic simulation passes, layout design system module 130 is used to generate a layout design based upon the schematic design. In turn, layout design simulator 140 verifies the layout design, such as through LVS (layout versus schematic), DRC (design rules check), or other layout verification tests. If the layout verification fails, the designer uses layout design system module 130 to modify the design layout as needed by replacing a pre-marked circuit element object with a different pre-marked circuit element object having different pre-assigned voltage values.

Once the layout design verification process passes, design tool system 100 generates mask layer data, such as GDS II (Graphic Database System II) data, to send to mask fabrication facility 170, which generates masks that are used for construction of a corresponding integrated circuit.

Figure 2:
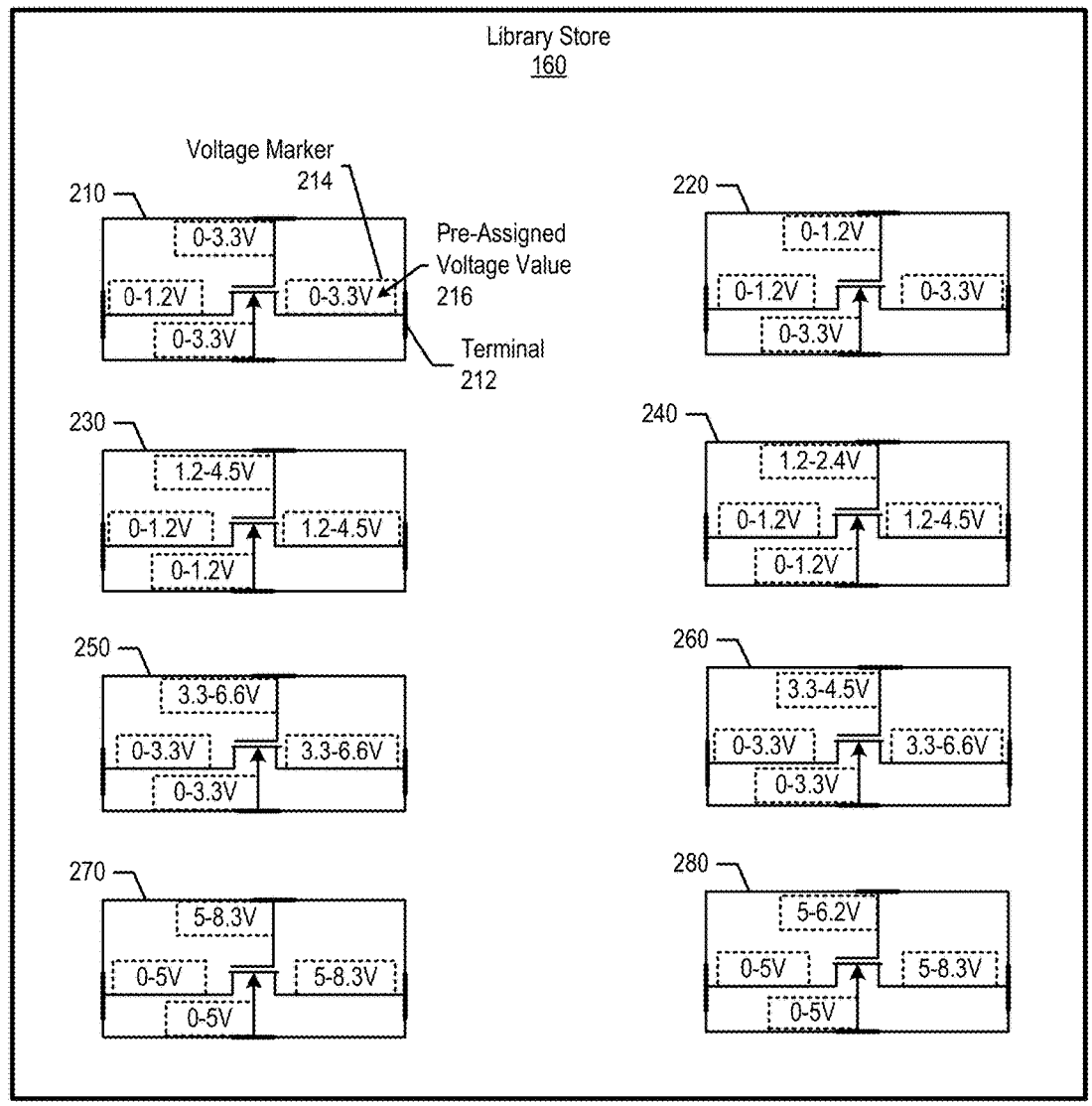
FIG. 2 is a diagram depicting one example of a library that includes various pre-marked circuit element objects corresponding to an N-channel MOSFET supported in a semiconductor technology.

FIG. 2 is a diagram depicting one example of a library that includes various pre-marked circuit element objects corresponding to an N-channel MOSFET supported in a semiconductor technology. Library store 160 may also include pre-marked circuit element objects corresponding to other semiconductor circuit elements such as P-channel MOSFETs, resistors, capacitors, diodes, etcetera.

Circuit element objects 210 through 280 each include four terminals and four corresponding embedded voltage markers. FIG. 2 depicts references numerals for terminal 112 of circuit element object 210 but does not show detail for the other terminals and other circuit element objects for simplicity purposes. Terminal 212 includes an embedded voltage marker 214 that stores pre-assigned voltage value 216.

Each of the circuit element objects in library store 160 correspond to a unique terminal voltage value combination because they each include one or more different terminal voltage values on one of their terminals. For example, pre-marked circuit element object 210 and pre-marked circuit element object 220 have the same terminal voltage values except for their gate terminal voltage values. Pre-marked circuit element object 210 supports a 0-3.3V gate voltage range and pre-marked circuit element object 220 supports a 0-1.2V gate voltage range. Library 160's wide variety of pre-marked circuit element objects enables a designer to select a specific pre-marked circuit element object that matches each net voltage value for a specific insertion point of a schematic design (see FIG. 3 and corresponding text for further details).

Figure 3:
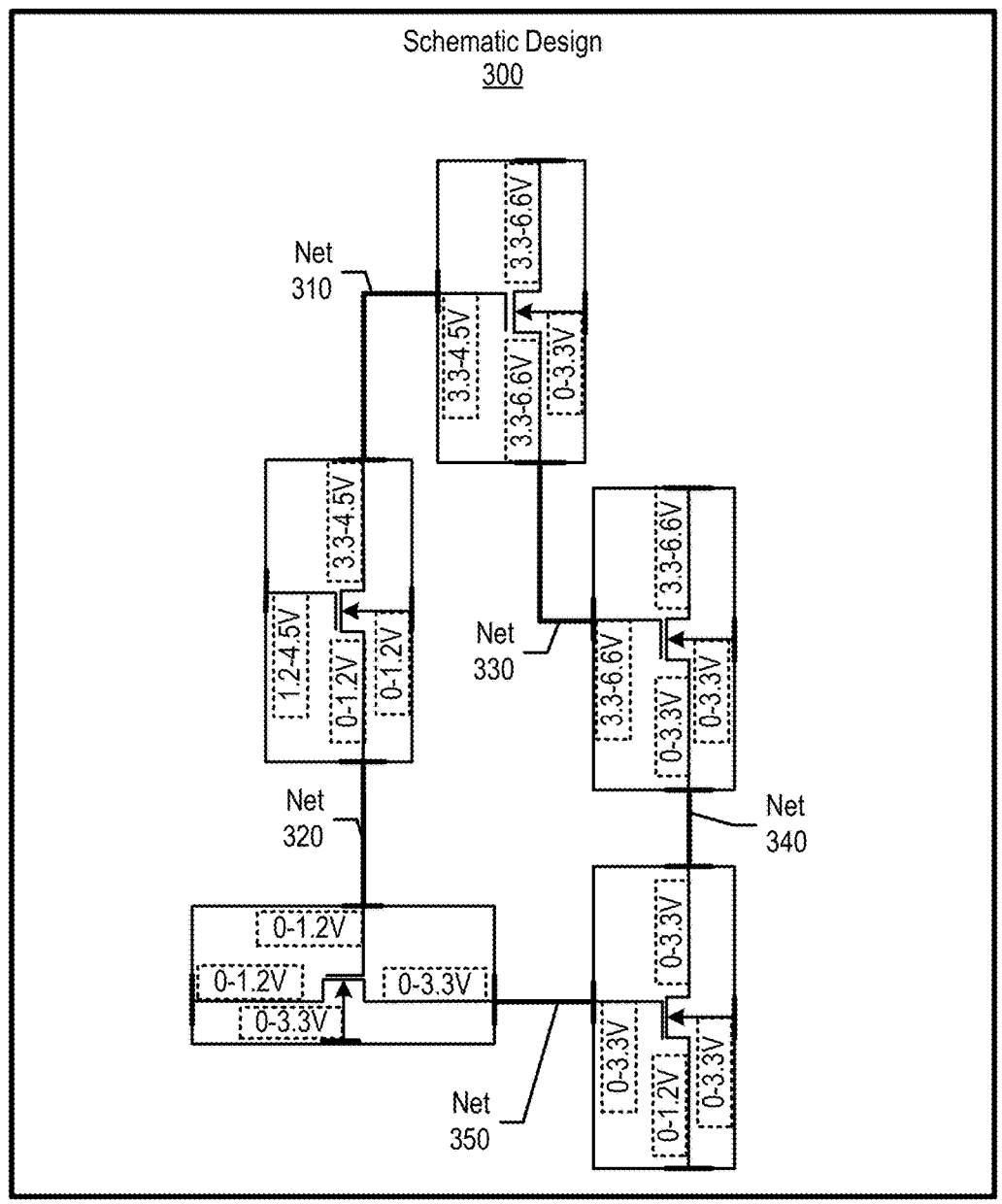
FIG. 3 is a diagram depicting one example of a schematic design that includes valid nets throughout the schematic design.

FIG. 3 is a diagram depicting one example of a schematic design that includes valid nets throughout the schematic design. Schematic design 300 includes five different pre-marked circuit element objects linked via nets 310, 320, 330, 340, and 350. Each net is valid because each pre-marked circuit element object's terminal voltage value on any given net matches. Net 310 links two pre-marked circuit element objects' terminals having pre-assigned voltage values of 3.3-4.5V. Net 320 links two pre-marked circuit element objects' terminals having pre-assigned voltage values of 0-1.2V. Net 330 links two pre-marked circuit element objects' terminals having pre-assigned voltage values of 3.3-6.6V. Net 340 links two pre-marked circuit element objects' terminals having pre-assigned voltage values of 0-3.3V, and net 350 links two pre-marked circuit element objects' terminals having pre-assigned voltage values of 0-3.3V.

Figure 4:
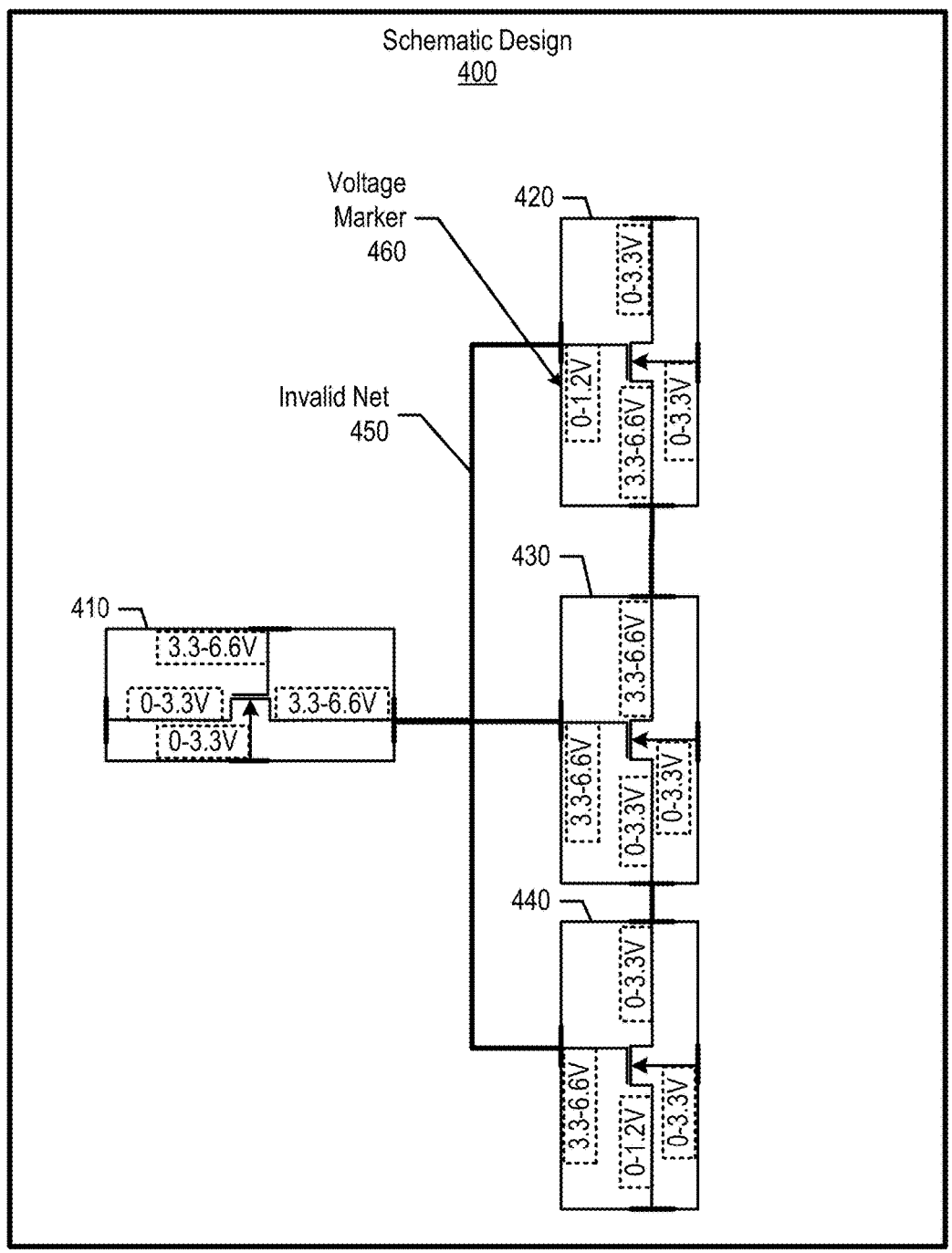
FIG. 4 is a diagram depicting one example of a schematic design that includes an invalid net.

FIG. 4 is a diagram depicting one example of a schematic design that includes an invalid net. Schematic design 400 includes four pre-marked circuit element objects 410, 420, 430, and 440. As currently placed, net 450 is invalid because pre-marked circuit element object 420's voltage marker has a 0-1.2V gate voltage value stored in voltage marker 460, which is different from the voltage values of the other three terminals connected to net 450. As a result, in one embodiment, the design tool system informs the designer of invalid net 450 when pre-marked circuit element object 420 is inserted into schematic design 400 (see FIG. 6). In another embodiment, the design tool system informs the designer of invalid net 450 during schematic simulation (see FIG. 5).

Figure 5:
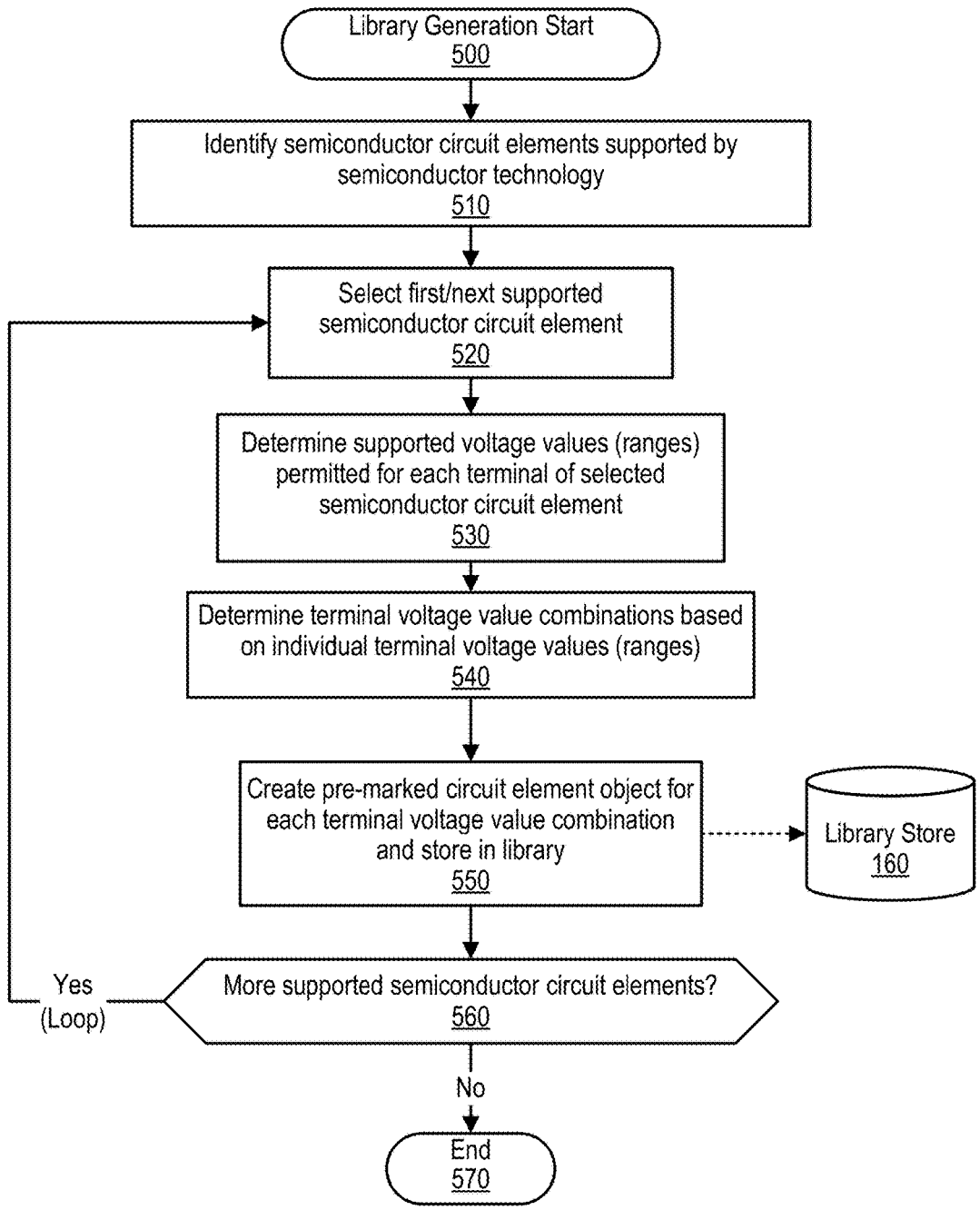
FIG. 5 is a diagram depicting one example of a flowchart showing steps taken by a library generator system to generate a pre-marked circuit element object library.

FIG. 5 is a diagram depicting one example of a flowchart showing steps taken by a library generator system to generate a pre-marked circuit element object library. Processing commences at 500, whereupon the process identifies a list of supported semiconductor circuit elements at 510, such as from a Design Rules Manual (DRM) or a Process Design Kit (PDK) file. At 520, the process selects a first one of the supported semiconductor circuit elements and, at 530, the process determines the supported voltage values permitted on each terminal of the selected semiconductor circuit element, such as by accessing an assignment table that includes a list of supported voltage values. For example, a semiconductor circuit element may have three terminals and each of the terminals supports two voltage values. In one embodiment, the supported voltage values are supported voltage ranges, such as 0-3.3 volts.

At 540, the process determines terminal voltage value combinations based upon the individual terminal voltage values that were determined at 530. For example, if a semiconductor circuit element has three terminals each supporting two voltage values, the process determines that eight terminal voltage value combinations are possible.

The process, at 550, creates a different pre-marked circuit element object for each terminal voltage range combination and stores each of the pre-marked circuit element objects in library store 160. Referring to FIG. 2, library store 160 includes eight different pre-marked circuit element objects having various terminal voltage value combinations for a single semiconductor circuit element.

The process determines whether there are more supported semiconductor circuit elements for which to generate pre-marked circuit element objects (decision 560). If there are more supported semiconductor circuit elements, decision 560 branches to the "Yes" branch, which loops back to select the next semiconductor circuit element and generate corresponding pre-marked circuit element objects. This looping continues until each of the supported semiconductor circuit elements are processed, at which point decision 560 branches to the "No" branch, whereupon processing ends at 570. In turn, designers may utilize the stored pre-marked circuit element objects in library store 160 to create schematic designs (see FIGS. 6-7 and corresponding text for further details). In one embodiment, the design tool system may provide an interface to a designer that allows the designer to specify a pre-marked circuit element object through a pull-down or selection process (see FIG. 8 and corresponding text for further details).

Figure 6:
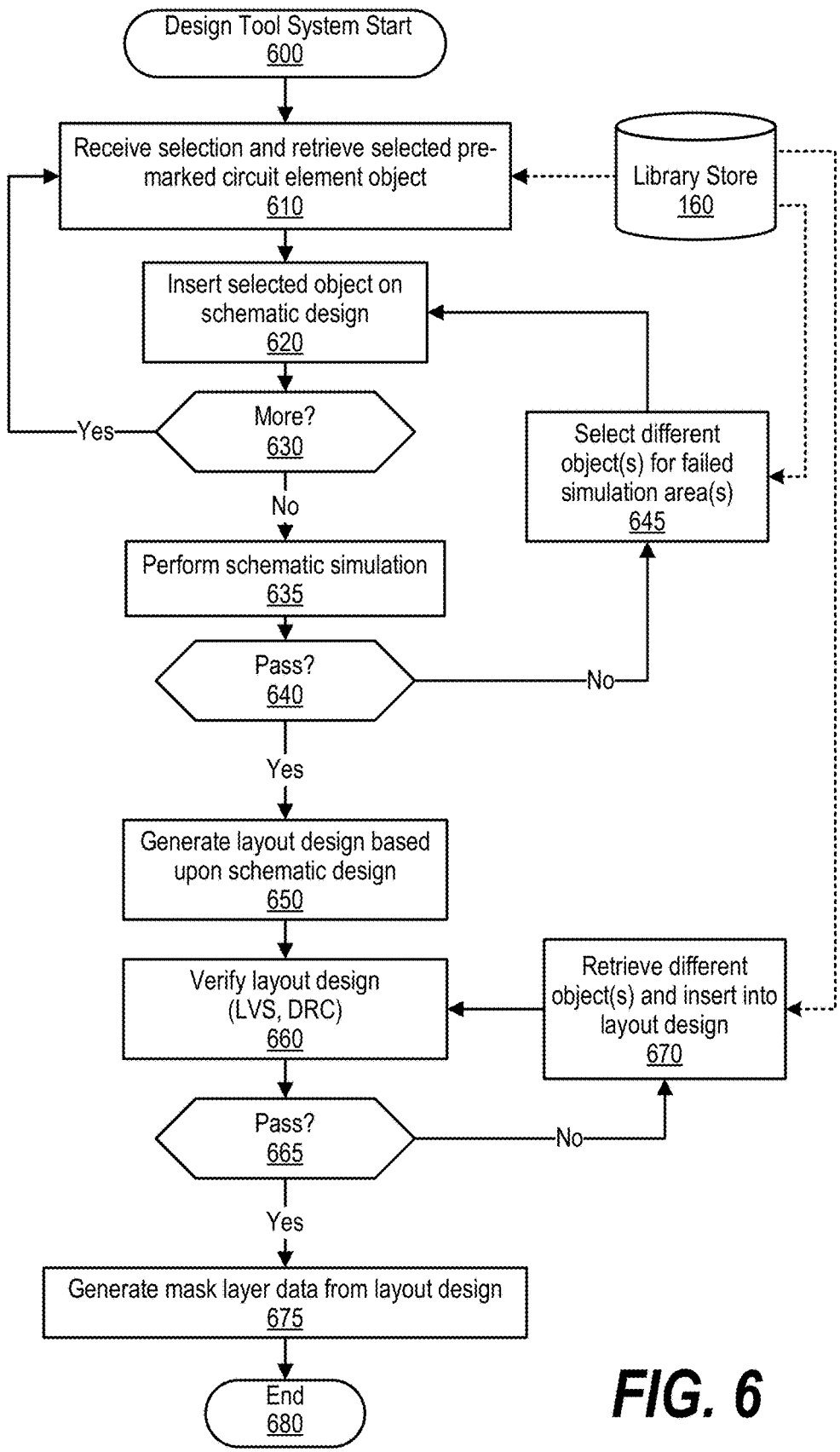
FIG. 6 is a diagram depicting one example of a flowchart showing steps taken by a design tool system that utilizes pre-marked circuit element objects to create a schematic design, a layout design, and generate mask layer data for construction of an integrated circuit.

FIG. 6 is a diagram depicting one example of a flowchart showing steps taken by a design tool system that utilizes pre-marked circuit element objects to create a schematic design, a layout design, and generate mask layer data for construction of an integrated circuit. Processing commences at 600, whereupon the process receives a circuit designer's selection via a schematic designer module and selects a pre-marked circuit element object accordingly from library store 160 (610).

At 620, the process inserts the selected circuit element object on a schematic design and connects the terminals of the inserted circuit element object to nets, which connect terminals of other circuit element objects. The process determines whether the designer wishes to select more pre-marked circuit element objects to insert into the schematic design (decision 630). If the designer provides more pre-marked circuit element object selections, decision 630 branches to the "Yes" branch, which loops back to select and insert the selected pre-marked circuit element object in the schematic design. This looping continues until the designer is finished inserting circuit element objects into the schematic design, at which point decision 630 branches to the "No" branch.

At 635, the process performs a schematic simulation, and the process determines whether the simulation passed (decision 640). If the simulation does not pass, decision 640 branches to the "No" branch, whereupon the process selects different marked circuit element objects for the failed simulation areas that, in one embodiment, are indicated in the simulation results (645). For example, referring to FIG. 4, the process or circuit designer replaces pre-marked circuit element object 420 with a different pre-marked circuit element object having compatible pre-assigned voltage values for each net. This looping continues until the schematic simulation passes, at which point decision 640 branches to the "Yes" branch to begin the layout design phase.

At 650, the process generates a layout design based upon the schematic design that passed the simulation. For example, a layout design tool may access layout information from library store 160 to instantiate the circuit element objects from the schematic design into the layout design with the proper connections per the schematic. At 660, the process verifies the layout design using verification tests such as LVS or DRC, and determines whether the layout design passed verification (decision 665). If the layout design does not pass verification, decision 665 branches to the "No" branch, whereupon the process retrieves different circuit element objects corresponding to failed layout design areas and instantiates the circuit element objects into the layout design (670). In one embodiment, a circuit designer uses layout design system module 130 to replace pre-marked circuit element objects in the layout design as needed. In this embodiment, the circuit designer is not required to revert to schematic design system module 110 because the pre-marked circuit element objects include embedded voltage markers that allow the circuit designer to select a compatible pre-marked circuit element object. In another embodiment, the design tool system automatically replaces incompatible pre-marked circuit element objects with compatible pre-marked circuit element objects when the layout design verification fails.

When the layout design passes verification, decision 665 branches to the "Yes" branch whereupon the process generates mask layer data from the layout design at 675. For example, the design tool system may create GDS II data that is sent to a mask fabrication facility, which generates masks that are utilized to fabricate an integrated circuit based upon the schematic design and layout design. Processing ends at 680.

Figure 7:
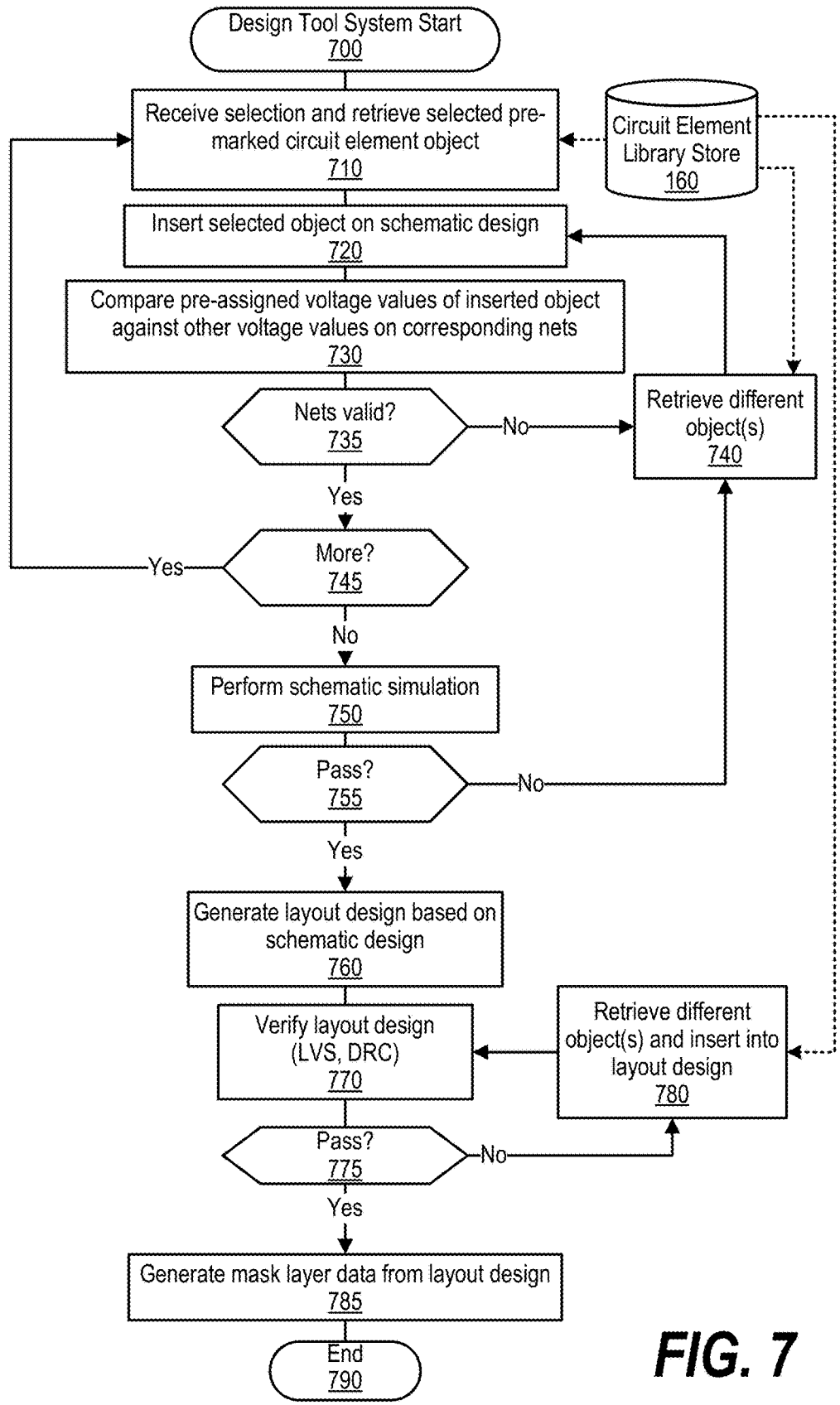
FIG. 7 a diagram depicting one example of a flowchart showing another embodiment of steps taken by a design tool system that utilizes pre-marked circuit element objects to create a schematic design, a layout design, and generate mask layer data for construction of an integrated circuit.

FIG. 7 a diagram depicting one example of a flowchart showing another embodiment of steps taken by a design tool system that utilizes pre-marked circuit element objects to create a schematic design, a layout design, and generate mask layer data for construction of an integrated circuit. FIG. 7 includes steps to determine voltage value compatibility on each terminal of an inserted circuit element object at the time that the circuit element object is inserted into the schematic design, as opposed to determining compatibility during simulation as depicted in FIG. 6.

Processing commences at 700, whereupon the process receives a circuit designer's selection via a schematic designer module and selects a pre-marked circuit element object accordingly from library store 160 (710). At 720, the process inserts the selected circuit element object on a schematic design and connects the terminals of the inserted circuit element object to their corresponding nets. The process, at 730, compares the pre-marked circuit element object's terminal voltage values against other circuit element objects on their corresponding nets. For example, the schematic design tool may traverse through the terminal voltage values for nets that have experienced a change and ensure that every terminal of every circuit element object on that net still has the same voltage values allowed.

The process determines whether the insertion of the pre-marked circuit element object creates one or more invalid nets based upon the comparison at 730 (decision 735). If one of the nets is invalid, decision 735 branches to the "No" branch, whereupon the process, or circuit designer, selects a different pre-marked circuit element object with compatible pre-assigned voltage values at 740, which the process inserts on the schematic design in place of the circuit element object causing the failure. This looping continues until the process verifies that the inserted circuit element object results in valid nets, at which point decision 735 branches to the "Yes" branch.

The process determines whether the designer wishes to insert more pre-marked circuit element objects on the schematic design (decision 745). If the designer provides more pre-marked circuit element object selections, decision 745 branches to the "Yes" branch, which loops back to select and insert the selected pre-marked circuit element object into the schematic design. This looping continues until the circuit designer is finished with the schematic design, at which point decision 745 branches to the "No" branch.

At 750, the process performs a schematic simulation, and the process determines whether the simulation passed (decision 755). If the simulation does not pass, decision 755 branches to the "No" branch, whereupon the process selects different marked circuit element objects for the failed simulation areas at 740. This looping continues until the schematic simulation passes, at which point decision 755 branches to the "Yes" branch to begin the layout design phase.

At 760, the process generates a layout design based upon the schematic design. At 770, the process verifies the layout design using verification tests such as LVS or DRC, and determines whether the layout design passed verification (decision 775). If the layout design does not pass verification, decision 775 branches to the "No" branch, whereupon the process retrieves different circuit element objects corresponding to failed layout design areas and instantiates the circuit element objects into the layout design (780).

When the layout design passes verification, decision 775 branches to the "Yes" branch whereupon the process generates mask layer data from the layout design at 785, and processing ends at 790.

Figure 8:
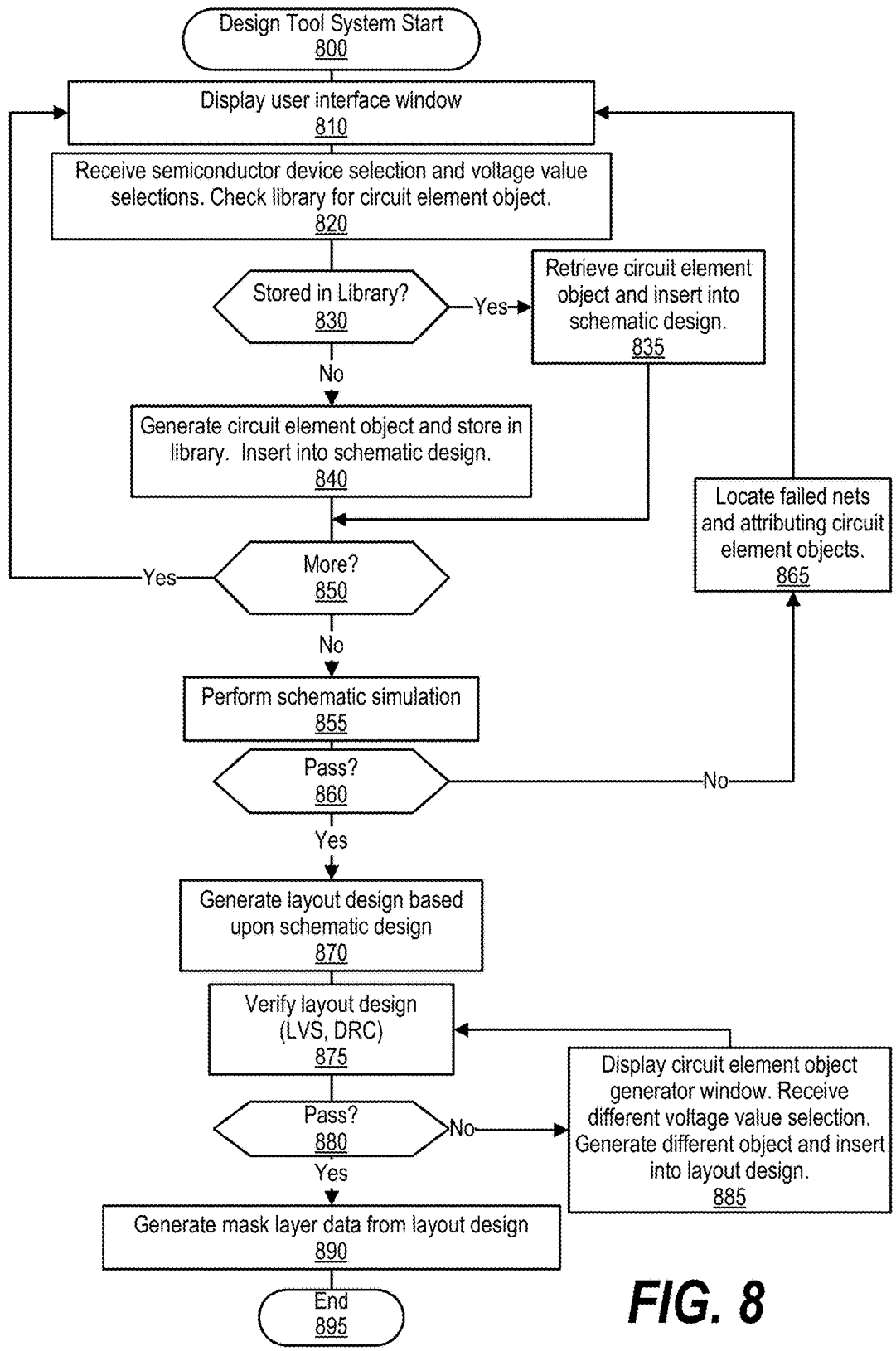
FIG. 8 is a diagram depicting one example of a flowchart showing another embodiment of steps taken by a design tool system that utilizes pre-marked circuit element objects to create a schematic design, a layout design, and generate mask layer data for construction of an integrated circuit.

FIG. 8 is a diagram depicting one example of a flowchart showing another embodiment of steps taken by a design tool system that utilizes pre-marked circuit element objects to create a schematic design, a layout design, and generate mask layer data for construction of an integrated circuit. FIG. 8 includes steps to receive terminal voltage value selections from a designer during schematic design via a user interface and dynamically generate a pre-marked circuit element object based upon the received terminal voltage value selections. As a result, the designer is not burdened by manually searching through a library for a compatible pre-marked circuit element object.

Processing commences at 800, whereupon the process displays a user interface window to a designer at 810. In one embodiment, the user interface window includes a semiconductor circuit element selection area and voltage value selection area. In this embodiment, the designer selects a semiconductor circuit element, such as an N-channel MOSFET, and then selects voltage values to assign to each of the circuit element's terminals.

The process receives the designer's selections at 820 and determines whether the corresponding pre-marked circuit element object has already been generated and is stored in library store 160 (decision 830). If the pre-marked circuit element object is located in library store 160, decision 830 branches to the "Yes" branch, whereupon the process retrieves the pre-marked circuit element object from library store 160 and inserts the pre-marked circuit element object into the schematic design (835). On the other hand, if the pre-marked circuit element object does not reside in library store 160, decision 830 branches to the "No" branch. The process generates the pre-marked circuit element object based upon the user selection received at 820 and inserts the generated pre-marked circuit element object into the schematic design (840). The process also stores the pre-marked circuit element object in library store 160, shown in FIG. 1, for further use.

In one embodiment, as discussed earlier but not shown in FIG. 8 for simplicity purposes, the process determines whether the placement of the pre-marked circuit element object creates one or more invalid nets when the pre-marked circuit element object is inserted into the schematic design. In this embodiment, the process informs the designer to adjust the terminal voltage values accordingly via the user interface window and select or generate a different pre-marked circuit element object.

The process determines whether the designer wishes to place more pre-marked circuit element objects on the schematic design (decision 850). If the designer wishes to place more pre-marked circuit element objects on the schematic design, decision 850 branches to the "Yes" branch, which loops back to display the user interface window to the designer and receive more circuit element object selections. This looping continues until the circuit designer is finished with the schematic design, at which point decision 850 branches to the "No" branch.

At 855, the process performs a schematic simulation and determines whether the simulation passed (decision 860). If the simulation does not pass, decision 860 branches to the "No" branch, whereupon the process locates pre-marked circuit element objects that attribute to the failure (865) and informs the designer to replace the located circuit element objects accordingly via the user interface window. This looping continues until the schematic simulation passes, at which point decision 860 branches to the "Yes" branch to begin the layout design phase.

At 870, the process generates a layout design based upon the schematic design. At 875, the process verifies the layout design using verification tests such as LVS or DRC, and determines whether the layout design passed verification (decision 880). If the layout design does not pass verification, decision 880 branches to the "No" branch, whereupon the process displays the user interface window, receives different voltage value selection for the pre-marked circuit element objects attributing to the failure, generate different pre-marked circuit element objects using the different voltage values, and inserts the different pre-marked circuit element objects into the layout design (885).

This looping continues until the layout design passes verification, at which point decision 880 branches to the "Yes" branch whereupon the process generates mask layer data from the layout design at 890, and processing ends at 895.

According to one embodiment of the present disclosure, a design tool system inserts into a schematic design a first circuit element object that includes first terminals having pre-assigned voltage values. The design tool system connects each of the first terminals to second terminals corresponding to second circuit element objects. The design tool system generates a layout design from the schematic design when the first pre-assigned voltage values match their connected second pre-assigned voltage values. In turn, the design tool system generates mask layer data from the layout design that is configured to generate masks for construction of an integrated circuit corresponding to the schematic design.

According to another embodiment of the present disclosure, the design tool system selects a semiconductor circuit element and determines terminal voltage value combinations corresponding to the selected semiconductor circuit element. In turn, the design tool system generates pre-marked circuit element objects for each of the terminal voltage value combinations and stores the pre-marked circuit element objects in a library.

According to yet another embodiment of the present disclosure, the pre-assigned voltage values are stored in voltage markers embedded in the first circuit element object prior to inserting the first circuit element object into the schematic design. According to yet another embodiment of the present disclosure, at least one of the markers is a polygon, a polygon property, or a text field.

According to yet another embodiment of the present disclosure, the design tool system displays a user interface window to a user and receives terminal voltage value selections from the user. In turn, the design tool system generates a circuit element object that includes terminals and corresponding pre-assigned voltage values based upon the received terminal voltage value selections.

According to yet another embodiment of the present disclosure, the design tool system inserts a third circuit element object into the schematic design that includes third terminals with corresponding pre-assigned voltage values. The design tool system connects at least one of the third terminals to at least one of the first terminals and determines that the connected third terminal's pre-assigned voltage value does not match the connected first terminal's pre-assigned voltage value. As such, the design tool system replaces the third circuit element object with a fourth circuit element object that has a pre-assigned voltage value that matches the first terminal's pre-assigned voltage value.

According to yet another embodiment of the present disclosure, when the design tool system determines that the layout design fails one of the verification tests, the design tool system replaces the first circuit element object with a third circuit element object in the layout design that includes a different pre-assigned voltage value compared with the first circuit element object.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, a software embodiment (including firmware, resident software, micro-code, etc.), including processing circuitry for executing thereof, or an embodiment combining software and hardware aspects that may all generally be referred to herein as a "circuit," "module" or "system."

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other circuit element objects to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other circuit element objects to cause a series of operational steps to be performed on the computer, other programmable apparatus or other circuit element objects to produce a computer implemented process such that the instructions which execute on the computer or other programmable apparatus provide processes for implementing the functions/acts specified in the flowchart and/or block diagram block or blocks.

Figure 9:
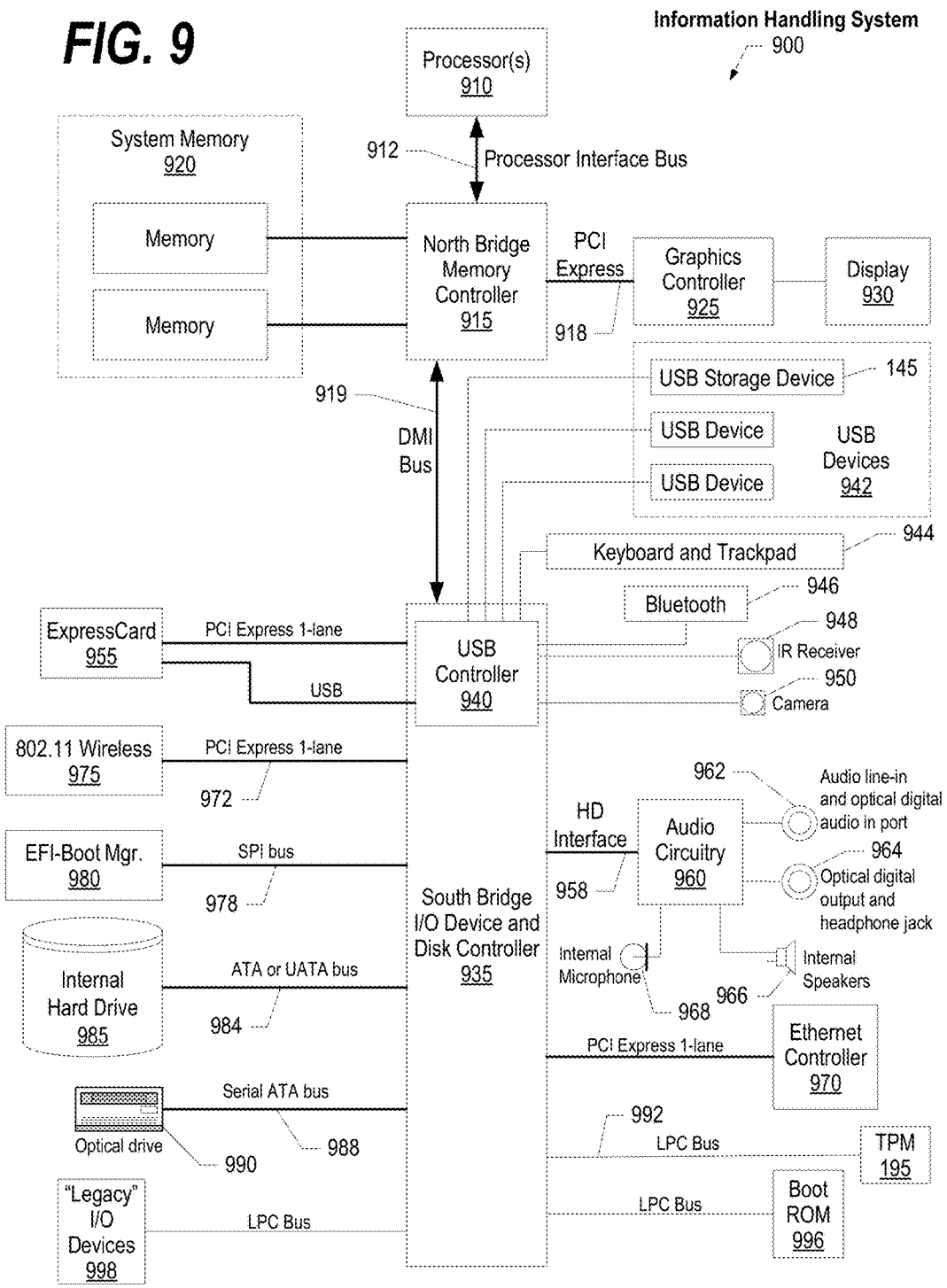
FIG. 9 is a block diagram of a data processing system in which the methods described herein can be implemented.

FIG. 9 illustrates information handling system 900, which is a simplified example of a computer system capable of performing the computing operations described herein. Information handling system 900 includes one or more processors 910 coupled to processor interface bus 912. Processor interface bus 912 connects processors 910 to Northbridge 915, which is also known as the Memory Controller Hub (MCH). Northbridge 915 connects to system memory 920 and provides a means for processor(s) 910 to access the system memory. Graphics controller 925 also connects to Northbridge 915. In one embodiment, PCI Express bus 918 connects Northbridge 915 to graphics controller 925. Graphics controller 925 connects to display circuit element object 930, such as a computer monitor.

Northbridge 915 and Southbridge 935 connect to each other using bus 919. In one embodiment, the bus is a Direct Media Interface (DMI) bus that transfers data at high speeds in each direction between Northbridge 915 and Southbridge 935. In another embodiment, a Peripheral Component Interconnect (PCI) bus connects the Northbridge and the Southbridge. Southbridge 935, also known as the I/O Controller Hub (ICH) is a chip that generally implements capabilities that operate at slower speeds than the capabilities provided by the Northbridge. Southbridge 935 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth circuit element objects, such as boot ROM 996 and "legacy" I/O circuit element objects (using a "super I/O" chip). The "legacy" I/O circuit element objects (998) can include, for example, serial and parallel ports, keyboard, mouse, and/or a floppy disk controller. The LPC bus also connects Southbridge 935 to Trusted Platform Module (TPM) 995. Other components often included in Southbridge 935 include a Direct Memory Access (DMA) controller, a Programmable Interrupt Controller (PIC), and a storage circuit element object controller, which connects Southbridge 935 to nonvolatile storage circuit element object 985, such as a hard disk drive, using bus 984.

ExpressCard 955 is a slot that connects hot-pluggable circuit element objects to the information handling system. ExpressCard 955 supports both PCI Express and USB connectivity as it connects to Southbridge 935 using both the Universal Serial Bus (USB) the PCI Express bus. Southbridge 935 includes USB Controller 940 that provides USB connectivity to circuit element objects that connect to the USB. These circuit element objects include webcam (camera) 950, infrared (IR) receiver 948, keyboard and trackpad 944, and Bluetooth circuit element object 946, which provides for wireless personal area networks (PANs). USB Controller 940 also provides USB connectivity to other miscellaneous USB connected circuit element objects 942, such as a mouse, removable nonvolatile storage circuit element object 945, modems, network cards, ISDN connectors, fax, printers, USB hubs, and many other types of USB connected circuit element objects. While removable nonvolatile storage circuit element object 945 is shown as a USB-connected circuit element object, removable nonvolatile storage circuit element object 945 could be connected using a different interface, such as a Firewire interface, etcetera.

Wireless Local Area Network (LAN) circuit element object 975 connects to Southbridge 935 via the PCI or PCI Express bus 972. LAN circuit element object 975 typically implements one of the IEEE 802.11 standards of over-the-air modulation techniques that all use the same protocol to wireless communicate between information handling system 900 and another computer system or circuit element object. Optical storage circuit element object 990 connects to Southbridge 935 using Serial ATA (SATA) bus 988. Serial ATA adapters and circuit element objects communicate over a high-speed serial link. The Serial ATA bus also connects Southbridge 935 to other forms of storage circuit element objects, such as hard disk drives. Audio circuitry 960, such as a sound card, connects to Southbridge 935 via bus 958. Audio circuitry 960 also provides functionality such as audio line-in and optical digital audio in port 962, optical digital output and headphone jack 964, internal speakers 966, and internal microphone 968. Ethernet controller 970 connects to Southbridge 935 using a bus, such as the PCI or PCI Express bus. Ethernet controller 970 connects information handling system 900 to a computer network, such as a Local Area Network (LAN), the Internet, and other public and private computer networks.

While FIG. 9 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming circuit element object, ATM machine, a portable telephone circuit element object, a communication circuit element object or other circuit element objects that include a processor and memory.

The Trusted Platform Module (TPM 995) shown in FIG. 9 and described herein to provide security functions is but one example of a hardware security module (HSM). Therefore, the TPM described and claimed herein includes any type of HSM including, but not limited to, hardware security circuit element objects that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 10.

Figure 10:
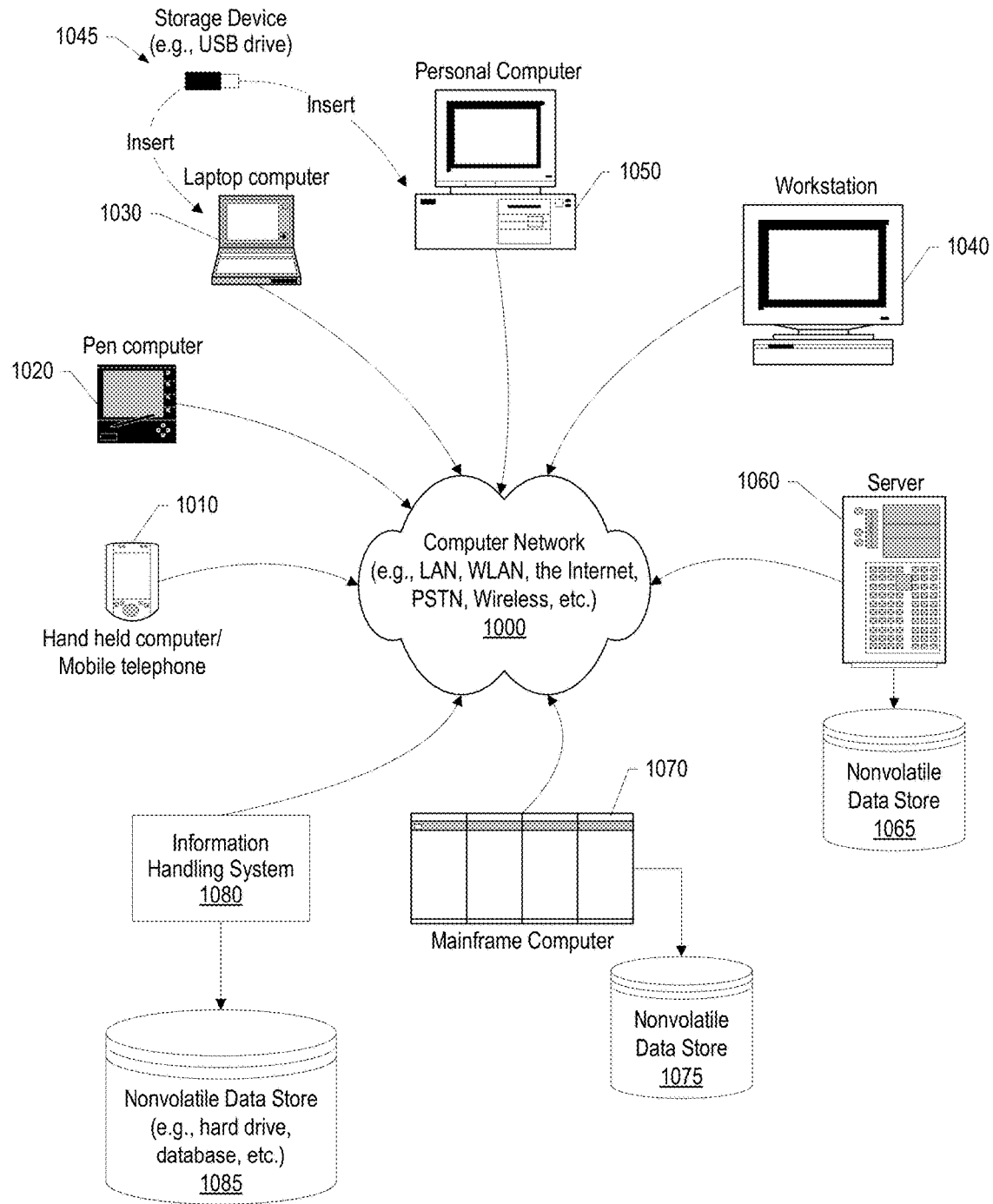
FIG. 10 provides an extension of the information handling system environment shown in FIG. 9 to illustrate that the methods described herein can be performed on a wide variety of information handling systems which operate in a networked environment.

FIG. 10 provides an extension of the information handling system environment shown in FIG. 9 to illustrate that the methods described herein can be performed on a wide variety of information handling systems that operate in a networked environment. Types of information handling systems range from small handheld circuit element objects, such as handheld computer/mobile telephone 1010 to large mainframe systems, such as mainframe computer 1070. Examples of handheld computer 1010 include personal digital assistants (PDAs), personal entertainment circuit element objects, such as MP3 players, portable televisions, and compact disc players. Other examples of information handling systems include pen, or tablet, computer 1020, laptop, or notebook, computer 1030, workstation 1040, personal computer system 1050, and server 1060. Other types of information handling systems that are not individually shown in FIG. 10 are represented by information handling system 1080. As shown, the various information handling systems can be networked together using computer network 1000. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 10 depicts separate nonvolatile data stores (server 1060 utilizes nonvolatile data store 1065, mainframe computer 1070 utilizes nonvolatile data store 1075, and information handling system 1080 utilizes nonvolatile data store 1085). The nonvolatile data store can be a component that is external to the various information handling systems or can be internal to one of the information handling systems. In addition, removable nonvolatile storage circuit element object 1045 can be shared among two or more information handling systems using various techniques, such as connecting the removable nonvolatile storage circuit element object 1045 to a USB port or other connector of the information handling systems.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method of utilizing a pre-marked circuit element object library to create an integrated circuit, the method comprising:

inserting a first circuit element object into a schematic design, wherein the first circuit element object comprises a plurality of first terminals, and wherein each of the first terminals has one of a plurality of first pre-assigned voltage values;

connecting each of the first terminals to one or more second terminals, wherein each of the one or more second terminals correspond to one or more second circuit element objects;

generating a layout design from the schematic design in response to determining that the first pre-assigned voltage value of each of the first terminals matches a second pre-assigned voltage value of the one or more second terminals to which it is connected;

determining whether the layout design passes or fails at least one of the one or more verification tests;

replacing the first circuit element object with a third circuit element object in the layout design, in responses to a determination that the layout design fails the at least one of the one or more verification tests, wherein the third circuit element object comprises at least one of a plurality of third pre-assigned voltage values that is different than at least one of the plurality of first pre-assigned voltage values;

generating mask layer data in response to a determination that the layout design passes the one or more verification tests, wherein the mask layer data is configured to generate a plurality of masks for construction of an integrated circuit corresponding to the schematic design.

2. The method of claim 1 wherein, prior to the inserting of the first circuit element object, the method further comprises:

selecting a semiconductor circuit element from a plurality of semiconductor circuit elements;

determining a plurality of terminal voltage value combinations corresponding to the selected semiconductor circuit element;

generating a plurality of pre-marked circuit element objects for each of the plurality of terminal voltage value combinations, wherein the plurality of pre-marked circuit element objects comprise the first circuit element object; and storing the plurality of pre-marked circuit element objects in a library.

3. The method of claim 1 wherein each of the plurality of pre-assigned voltage values are stored in one of a plurality of voltage markers that are embedded in the first circuit element object prior to the inserting of the first circuit element object into the schematic design.

4. The method of claim 3 wherein at least one of the plurality of voltage markers is selected from the group consisting of a polygon, a polygon property, and a text field.

5. The method of claim 1 further comprising:
displaying a user interface window to a user;
receiving a plurality of terminal voltage value selections from the user in response to displaying the user interface window; and
generating a fourth circuit element object that comprises a plurality of fourth terminals and a plurality of fourth pre-assigned voltage values based upon the received plurality of terminal voltage value selections.

6. The method of claim 1 wherein at least one of the plurality of first pre-assigned voltage values comprises a pre-assigned voltage range.

7. A method of utilizing a pre-marked circuit element object library to create an integrated circuit, the method comprising:

inserting a first circuit element object into a schematic design, wherein the first circuit element object comprises a plurality of first terminals, and wherein each of the first terminals has one of a plurality of first pre-assigned voltage values;

connecting each of the first terminals to one or more second terminals, wherein each of the one or more second terminals correspond to one or more second circuit element objects;

generating a layout design from the schematic design in response to determining that the first pre-assigned voltage value of each of the first terminals matches a second pre-assigned voltage value of the one or more second terminals to which it is connected;

inserting a third circuit element object into the schematic design, wherein the third circuit element object comprises a plurality of third terminals, and wherein each of the plurality of third terminals has one of a plurality of third pre-assigned voltage values;

connecting at least one of the plurality of third terminals to at least one of the plurality of first terminals;

determining that the third pre-assigned voltage value corresponding to the connected third terminal fails to match the first pre-assigned voltage value of the first terminal to which it is connected;

replacing the third circuit element object with a fourth circuit element object in the schematic design that comprises a plurality of fourth terminals in response to the third pre-assigned voltage value failing to match the first pre-assigned voltage value;

connecting one of the fourth terminals to one of the first terminals;

generating a different layout design from the schematic design in response to determining that a fourth pre-assigned voltage value of the connected fourth terminal matches the first pre-assigned voltage value of the first terminal to which it is connected; and generating mask layer data in response to a determination that the layout design passes the one or more verification tests, wherein the mask layer data is configured to generate a plurality of masks for construction of an integrated circuit corresponding to the schematic design.

8. A design tool system comprising:
a schematic design system module configured to:
insert a first circuit element object into a schematic design, wherein the first circuit element object comprises a plurality of first terminals, and wherein each of the first terminals has one of a plurality of first pre-assigned voltage values; and connect each of the first terminals to one or more second terminals, wherein each of the one or more second terminals correspond to one or more second circuit element objects; and a layout design system module configured to:

generate a layout design from the schematic design in response to determining that the first pre-assigned voltage value of each of the first terminals matches a second pre-assigned voltage value of the one or more second terminals to which it is connected; and determine whether the layout design passes or fails at least one of one or more verification tests; and replace the first circuit element object with a third circuit element object in the layout design, in response to a determination that the layout design fails the at least one of the one or more verification tests, wherein the third circuit element object comprises at least one of a plurality of third pre-assigned voltage values that is different than at least one of the plurality of first pre-assigned voltage values generate mask layer data in response to a determination that the layout design passes the one or more verification tests, wherein the mask layer data is configured to generate a plurality of masks for construction of an integrated circuit corresponding to the schematic design.

9. The design tool system of claim 8 wherein the schematic design system module is further configured to:

display a user interface window to a user;

receive a plurality of terminal voltage value selections from the user in response to displaying the user interface window; and generate a fourth circuit element object that comprises a plurality of fourth terminals and a plurality of fourth pre-assigned voltage values based upon the received plurality of terminal voltage value selections.

10. A design tool system comprising:

a schematic design system module configured to:

insert a first circuit element object into a schematic design, wherein the first circuit element object comprises a plurality of first terminals, and wherein each of the first terminals has one of a plurality of first pre-assigned voltage values; and connect each of the first terminals to one or more second terminals, wherein each of the one or more second terminals correspond to one or more second circuit element objects;

a layout design system module configured to:

generate a layout design from the schematic design in response to determining that the first pre-assigned voltage value of each of the first terminals matches a second pre-assigned voltage value of the one or more second terminals to which it is connected;

wherein the schematic design system module is further configured to:

insert a third circuit element object into the schematic design, wherein the third circuit element object comprises a plurality of third terminals, and wherein each of the plurality of third terminals has one of a plurality of third pre-assigned voltage values;

connect at least one of the plurality of third terminals to at least one of the plurality of first terminals;

determine that the third pre-assigned voltage value corresponding to the connected third terminal fails to match the first pre-assigned voltage value of the first terminal to which it is connected;

replace the third circuit element object with a fourth circuit element object in the schematic design that comprises a plurality of fourth terminals in response to the third pre-assigned voltage value failing to match the first pre-assigned voltage value;

connect one of the fourth terminals to one of the first terminals; and generate mask layer data in response to a determination that the layout design passes the one or more verification tests, wherein the mask layer data is configured to generate a plurality of masks for construction of an integrated circuit corresponding to the schematic design.

11. The design tool system of claim 10 wherein the layout design system module is further configured to:

generate a different layout design from the schematic design in response to determining that a fourth pre-assigned voltage value of the connected fourth terminal matches the first pre-assigned voltage value of the first terminal to which it is connected.

* * * * *